(12) United States Patent
Peng (10) Patent No.: US 12,501,537 B2
(45) Date of Patent: Dec. 16, 2025

(54) HEAT DISSIPATION APPARATUS AND IN-VEHICLE MODULE

(71) Applicant: HUAWEI TECHNOLOGIES CO., LTD., Guangdong (CN)

(72) Inventor: Yaofeng Peng, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 214 days.

(21) Appl. No.: 18/512,344

(22) Filed: Nov. 17, 2023

(65) Prior Publication Data

US 2024/0090117 A1    Mar. 14, 2024

Related U.S. Application Data (63) Continuation of application No. PCT/CN2022/092032, filed on May 10, 2022.

(30) Foreign Application Priority Data

May 18, 2021 (CN) .......................... 202110542232.X
Nov. 11, 2021 (CN) .......................... 202111335609.0

(51) Int. Cl.
*H05K 1/00*    (2006.01)
*H05K 1/02*    (2006.01)
*H05K 1/14*    (2006.01)

(52) U.S. Cl.
CPC .......... *H05K 1/0203* (2013.01); *H05K 1/141* (2013.01); *H05K 2201/066* (2013.01)

(58) Field of Classification Search
CPC . H05K 1/0203; H05K 1/141; H05K 2201/066
(Continued)

(56) References Cited

U.S. PATENT DOCUMENTS 5,289,337 A * 2/1994 Aghazadeh ......... H01L 25/0655
                                                  257/E23.09
5,305,185 A * 4/1994 Samarov ............. H01L 23/4006
                                                    174/16.3
(Continued)

FOREIGN PATENT DOCUMENTS

CN    107396617 A    11/2017
CN    108882633 A    11/2018
(Continued)

OTHER PUBLICATIONS

Extended European Search Report dated Sep. 25, 2024, issued for European Application No. 22803832.9 (10 pages).
(Continued)

*Primary Examiner* — Zhengfu J Feng (57) ABSTRACT

A heat dissipation apparatus includes a heat sink housing including an upper housing and a lower housing. The upper and lowers housing are connected in a sealed manner. A primary PCB is fastened to the upper housing, and the primary PCB and the primary heat dissipation plate of the upper housing are disposed opposite to each other. A chip is fastened to a sub PCB. The sub PCB is electrically connected to the primary PCB by using a flexible conductive component. The sub PCB is connected to the primary PCB or the primary heat dissipation plate by using an elastic support component. The elastic support component is configured to press the sub PCB, to enable the chip to be closely attached to the primary heat dissipation plate of the upper housing. A thermally conductive layer is filled between the chip and the upper housing.

20 Claims, 3 Drawing Sheets

(58) Field of Classification Search
USPC .......................................................... 361/721
See application file for complete search history.

(56) References Cited

U.S. PATENT DOCUMENTS

| | | | | |
|---|---|---|---|---|
| 2007/0206361 | A1* | 9/2007 | Cheng | H01L 23/367 |
| | | | | 257/E23.102 |
| 2011/0164381 | A1* | 7/2011 | Lev | H01R 4/48 |
| | | | | 361/769 |
| 2017/0257983 | A1* | 9/2017 | Yu | H05K 7/20545 |

FOREIGN PATENT DOCUMENTS

| | | | | |
|---|---|---|---|---|
| CN | 209845432 U | 12/2019 | | |
| CN | 212851558 U | 3/2021 | | |
| EP | 1524893 A1 * | 4/2005 | ......... | H05K 7/20472 |
| WO | 2007055625 A1 | 5/2007 | | |

OTHER PUBLICATIONS

"Teardown: Delphi Audi zFAS Controller", Electronics360 News Desk, Dec. 10, 2019, total 3 pages, URL:https://electronics360.globalspec.com/article/14386/teardown-delphi-audi-zfas-controller.

* cited by examiner

HEAT DISSIPATION APPARATUS AND IN-VEHICLE MODULE

CROSS-REFERENCE TO RELATED APPLICATIONS

This application is a continuation of International Application No. PCT/CN2022/092032, filed on May 10, 2022, which claims priority to Chinese Patent Application No. 202110542232.X, filed on May 18, 2021 and Chinese Patent Application No. 202111335609.0, filed on Nov. 11, 2021. All of the aforementioned patent applications are hereby incorporated by reference in their entireties.

TECHNICAL FIELD

This disclosure relates to the field of in-vehicle electronic device technologies, and in particular to a heat dissipation apparatus and an in-vehicle module.

BACKGROUND

An in-vehicle module includes a metal housing and a circuit board that is disposed in an inner part of the metal housing. A plurality of devices with high power consumption are connected to the circuit board. A soft thermal interface material such as a thermal gel or a thermally conductive pad is filled between the device with high power consumption and the housing. Heat of the device with high power consumption may be transferred to the metal housing through the thermal interface material and then dissipated to the environment. As functions of the in-vehicle module become increasingly powerful, power consumption of a chip becomes increasingly high. Due to a large thickness and high thermal resistance of the thermal gel or the thermally conductive pad, a heat dissipation requirement cannot be met.

SUMMARY

Embodiments of this disclosure provide a heat dissipation apparatus and an in-vehicle module, to improve heat dissipation efficiency of a device with high power consumption.

According to first aspect, an embodiment of this disclosure provides a heat dissipation apparatus. The heat dissipation apparatus includes: a heat sink housing, a primary printed circuit board, a sub printed circuit board, and a chip. The heat sink housing includes an upper housing and a lower housing. The upper housing and the lower housing are connected in a sealed manner. The upper housing includes a primary heat dissipation plate. The primary printed circuit board is fastened to the upper housing, and the primary printed circuit board and the primary heat dissipation plate are disposed opposite to each other. The chip is fastened to the sub printed circuit board. The sub printed circuit board is electrically connected to the primary printed circuit board by using a flexible conductive component. The sub printed circuit board is connected to the primary printed circuit board or the primary heat dissipation plate by using an elastic support component. The elastic support component is configured to press the sub printed circuit board, to enable the chip to be closely attached to the primary heat dissipation plate of the upper housing. A thermally conductive layer is filled between the chip and the primary heat dissipation plate, and the thermally conductive layer is configured to reduce contact thermal resistance between the chip and the primary heat dissipation plate.

According to the heat dissipation apparatus provided in this embodiment of this application, a chip with high power consumption is separately fastened to the sub printed circuit board, and the sub printed circuit board is fastened to the primary printed circuit board or the primary heat dissipation plate by using a spring screw or another elastic support component. Therefore, signal interconnection is implemented between the sub printed circuit board and the primary printed circuit board by using the flexible conductive component. The elastic support component may absorb an assembly tolerance, to enable the chip to be closely attached to the heat sink housing. This may greatly reduce a thickness of the thermally conductive layer between the chip and the heat sink housing, reduce thermal resistance of the thermally conductive layer, effectively reduce a temperature of the chip, and reduce an over-temperature risk of the chip.

In a possible implementation, the sub printed circuit board is detachably connected to the elastic support component, and the sub printed circuit board and the chip form a replaceable component.

Due to this disposing, not only requirements of different customers for different types of chips may be met, but also applicability is high. In addition, if a capability of the chip is to be upgraded, only the chip and the sub printed circuit board need to be replaced. Therefore, an evolution capability is strong, and costs for upgrade and replacement are high.

In a possible implementation, the elastic support component includes a spring screw or an elastic spring.

The spring screw or the elastic spring has a sufficient support strength, and may be elastically deformed, to provide an elastic force, and enable the chip to be closely attached to the primary heat dissipation plate of the heat sink housing.

In a possible implementation, a head of the spring screw is located on a side, opposite to the primary printed circuit board, of the sub printed circuit board. A tail of the spring screw is connected to the primary printed circuit board, and a spring of the spring screw is located between the sub printed circuit board and the primary printed circuit board.

The primary printed circuit board is fastened relative to a position of the upper housing, and the spring disposed between the sub printed circuit board and the primary printed circuit board may provide a pressure for the sub printed circuit board, to enable the chip to be closely attached to the primary heat dissipation plate.

In a possible implementation, a structural support plate is further disposed on a side, away from the sub printed circuit board, of the primary printed circuit board. The structural support plate is fastened to the primary printed circuit board, and a projection of the elastic support component on the primary printed circuit board falls within a range of a projection of the structural support plate on the primary printed circuit board.

By disposing the structural support plate, rigidity of the primary printed circuit board may be increased. This may prevent a stress sensitive device on the primary printed circuit board from being damaged and disabled because of a deformation of the primary printed circuit board caused by an elastic force of the elastic support component.

In a possible implementation, a head of the spring screw is located on a side, opposite to the primary heat dissipation plate, of the sub printed circuit board. A tail of the spring screw is connected to the primary heat dissipation plate, and a spring of the spring screw is located between the sub printed circuit board and the head of the spring screw.

The head of the spring screw is fastened relative to the position of the upper housing, and a spring disposed between the head of the spring screw and the sub printed circuit board may provide a pressure for the sub printed circuit board, to enable the chip to be closely attached to the primary heat dissipation plate.

In a possible implementation, a thickness of the thermally conductive layer is less than 0.2 mm.

Under an action of the elastic support component, the chip is closely fastened to the primary heat dissipation plate of the heat sink housing. This may greatly reduce the thickness of the thermally conductive layer, reducing the thermal resistance of the thermally conductive layer, and effectively reducing the temperature of the chip.

In a possible implementation, the thermally conductive layer includes a thermal silicone grease or a thermal phase change film.

A coefficient of thermal conductivity of the thermal silicone grease and a coefficient of thermal conductivity of the thermal phase change film are relatively low, and a smallest thickness may be implemented in a process. This helps to reduce thermal resistance of the thermally conductive layer and reduce the temperature of the chip.

In a possible implementation, the flexible conductive component includes a flexible circuit board, a flexible connector, or a cable.

The signal interconnection between the sub printed circuit board and the primary printed circuit board may be implemented through the flexible circuit board, the flexible connector, or the cable. Because of a flexibility feature of the flexible conductive component (flexible circuit board, the flexible connector, or the cable), reliability of an electrical connection of the sub printed circuit board when floating up and down in a mounting process, can be ensured.

In a possible implementation, there are a plurality of elastic support components, and the plurality of elastic support components are evenly distributed on the sub printed circuit board.

By disposing the plurality of elastic support components, a uniform and reliable support force can be provided for the sub printed circuit board, and overall service life of the elastic support component can be improved.

In a possible implementation, there are a plurality of sub printed circuit boards, and at least one chip is disposed on one sub printed circuit board.

By disposing the plurality of sub printed circuit boards, heat between each of a plurality of chips with high power consumption and the primary heat dissipation plate of the heat sink housing may be dissipated through conduction. In addition, the plurality of the sub printed circuit boards are separately disposed. In comparison with disposing of a sub printed circuit board that has a relatively large area and that is capable of fastening the plurality of chips with high power consumption, other high devices on the primary printed circuit board may be avoided to a large extent. This facilitates arrangement of electronic devices on the primary printed circuit board.

In a possible implementation, the primary heat dissipation plate is an air-cooled heat dissipation plate or a liquid-cooled heat dissipation plate.

The primary heat dissipation plate is a region with highest heat dissipation efficiency in the heat dissipation apparatus, and may dissipate the heat in different forms such as air cooling or water cooling. In other words, the heat dissipation apparatus provided in this embodiment of this disclosure is applicable to an air-cooled heat sink or a liquid-cooled heat sink.

According to another aspect, an embodiment of this disclosure further provides an in-vehicle module. The in-vehicle module includes the foregoing heat dissipation apparatus.

According to the in-vehicle module provided in this embodiment of this application, the upper housing and the lower housing of the heat dissipation apparatus of the in-vehicle module are connected in the sealed manner by dispensing adhesive. Therefore, dust-proof and water-proof design requirements may be met. In addition, after the upper housing and the lower housing are fastened by dispensing adhesive, the upper housing and the lower housing do not float up and down. Therefore, reliability of fastening the connector is high, to prevent a connection failure of the connector.

According to the heat dissipation apparatus and the in-vehicle module provided in the embodiments of this application, the chip with high power consumption is separately fastened to the sub printed circuit board, and the sub printed circuit board is fastened to the primary printed circuit board or the primary heat dissipation plate by using the elastic support component. The elastic support component may absorb the assembly tolerance, to enable the chip to be closely attached to the heat sink housing. This can effectively reduce the over-temperature risk of the chip, and help to improve an overall heat dissipation effect of the in-vehicle module.

Descriptions of reference numerals:

100: heat dissipation apparatus; 11: heat sink housing; 111: upper housing; 1111: heat dissipation fin; 1112: primary heat dissipation plate; 1113: side wall; 1114: fixed boss; 112: lower housing; 12: primary printed circuit board; 13: sub printed circuit board; 14: chip; 15: flexible conductive component; 16: elastic support component; 17: thermally conductive layer; 18: structural support plate; 191: thermal interface material; 192: heat expansion plate; 193: thermal silicone grease; 194: threaded fastener; 200: connector.

DESCRIPTION OF EMBODIMENTS

Figure 1:
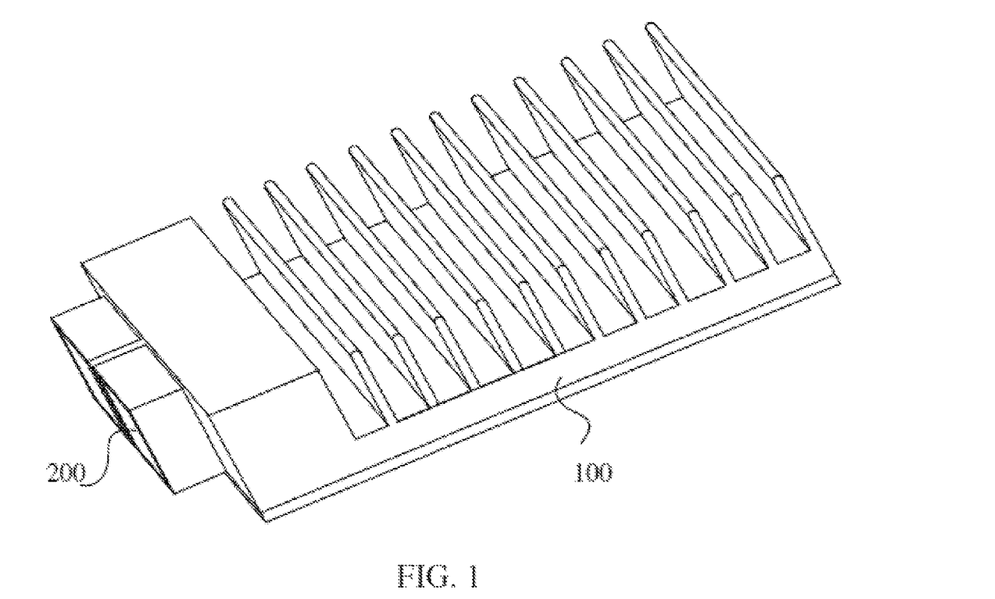
FIG. 1 is a schematic diagram of a structure of an in-vehicle module according to a related technology.

FIG. 1 is a schematic diagram of a structure of an in-vehicle module according to a related technology. Referring to FIG. 1, the in-vehicle module may include a heat dissipation apparatus 100 and a connector 200. A function of the in-vehicle module may be achieved through an external cable of the connector 200 or another device. The heat dissipation apparatus 100 may be configured to dissipate heat of the in-vehicle module in a timely manner, to prevent damage to the function of the in-vehicle module at a high temperature.

A primary printed circuit board and a plurality of electronic devices are disposed in an inner part of the in-vehicle module. Accumulation of dust or ingress of liquid greatly affects performance and service life of the primary printed circuit board and the electronic devices. Therefore, the in-vehicle module has high requirements for a dust-proof level and a water-proof level. The in-vehicle module may be disposed as a rigid sealed housing, and the housing may be a die-cast metal housing, to reach a dust-proof level and a water-proof level while meeting a heat dissipation requirement.

Figure 2:
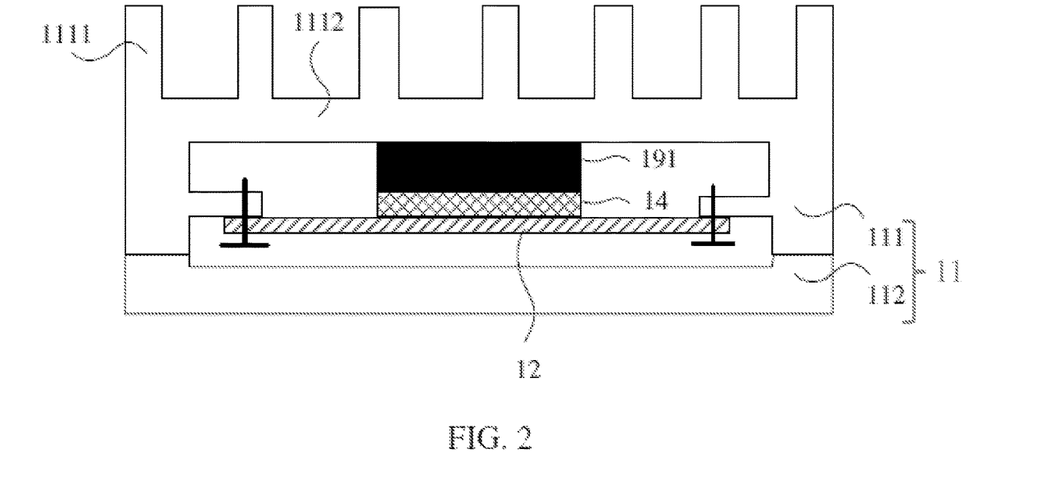
FIG. 2 is a schematic sectional view of a heat dissipation apparatus according to a related technology.

FIG. 2 is a schematic sectional view of a heat dissipation apparatus according to a related technology. Referring to FIG. 2, the heat dissipation apparatus 100 may include a heat sink housing 11 and a primary printed circuit board 12 that is disposed in an inner part of the heat sink housing 11. A chip 14 and another electronic device are disposed on the primary printed circuit board 12. Heat generated by the primary printed circuit board 12, the chip 14, and the another electronic device may be transferred to the heat sink housing 11 through radiation and convection. A plurality of heat dissipation fins 1111 are disposed on the heat sink housing 11, and heat transferred to the heat dissipation fins 1111 may be dissipated to external air through radiation and convection.

In the related technology, a soft thermal interface material 191 such as thermal gel or a thermally conductive pad is filled between the chip 14 and the heat sink housing 11. The thermal interface material 191 may thermally connect the chip 14 to the heat sink housing 11, to enable heat of the chip 14 to be transferred to the heat sink housing 11 through the thermal interface material 191 and then dissipated to an environment. This can improve heat dissipation efficiency.

The heat sink housing 11 may include an upper housing 111 and a lower housing 112. The upper housing 111 may include a primary heat dissipation plate 1112 and a side wall 1113 that is connected to a periphery of the primary heat dissipation plate 1112. The heat dissipation fins 1111 may be disposed on the primary heat dissipation plate 1112 of the upper housing 111. The upper housing 111 and the lower housing 112 may be connected in a sealed manner by dispensing adhesive, to enable the heat sink housing 11 to meet a dust-proof level and water-proof level. A fixed boss 1114 is disposed to protrude from the side wall 1113 of the upper housing 111. The primary printed circuit board 12 is fastened to the fixed boss 1114 and is disposed opposite to the primary heat dissipation plate 1112. The chip 14 is fastened to a side, facing the primary heat dissipation plate 1112, of the primary printed circuit board 12.

The chip 14 has a height tolerance, and the heat sink housing 11 has a tolerance, that is, a tolerance of the fixed boss 1114. Therefore, due to the two inevitable tolerances, a distance between the chip 14 and the primary heat dissipation plate 1112 is not a fixed value. In addition, the upper housing 111 and the lower housing 112 that are connected in the sealed manner may not float up and down for adjustment, that is, the two tolerances are not absorbed by changing a position of the upper housing 111 or the lower housing 112. Therefore, in the related technology, the soft thermal interface material 191 has a feature of flexible deformation, and also has an action of absorbing the tolerance.

However, as functions of an in-vehicle module become increasingly powerful, computing power of the chip 14 increases accordingly, power consumption of the chip 14 also becomes increasingly high, and a heat dissipation requirement is increasingly high. In the related technology, due to a large thickness and high thermal resistance of the thermal gel or the thermally conductive pad, a heat dissipation requirement for a chip with high power consumption cannot be met.

It should be noted that, $$\text{thermal resistance} = \text{filling thickness}/(\text{coefficient of thermal conductivity} \times \text{coating area on chip}) \quad \text{Formula 1}$$

Thermal resistance of the thermal interface material 191 may be calculated according to Formula 1.

$$\text{Temperature difference} = \text{power consumption of chip} \times \text{thermal resistance} \quad \text{Formula 2}$$

A temperature difference between an upper surface and a lower surface of the thermal interface material 191 may be obtained according to Formula 2.

A thermal gel with a good capability of absorbing a tolerance is used as an example of the thermal interface material 191. Considering a height tolerance of the chip 14, a thickness tolerance of the primary printed circuit board 12, and a processing tolerance of the heat sink housing 11, a filling thickness of the thermal gel is approximately 0.001 m, a coefficient of thermal conductivity of a current thermal gel with good thermal conductivity is approximately 8 W/mk, and the coating area on the chip is approximately 0.024 m×0.024 m. The filling thickness, the coefficient of thermal conductivity, and the coating area on the chip are substituted into Formula 1, to obtain thermal resistance of the thermal gel, that is, 0.217° C./W.

An artificial intelligence AI chip in an in-vehicle autonomous driving module is used as an example. The power consumption of the chip is 66 W. The power consumption of the chip and the thermal resistance of the thermal gel are substituted into Formula 2, to obtain a temperature difference between an upper surface and a lower surface of the thermal gel, that is, 14° C. The temperature difference is related to a temperature of the chip 14. By reducing the temperature difference between an upper surface and a lower surface of the thermal gel, the temperature of the chip 14 may be reduced, and an over-temperature risk of the chip 14 may be reduced.

It may be learned from Formula 1 and Formula 2 that, the thermal resistance of the thermal interface material 191 is related to the filling thickness and the coefficient of thermal conductivity of the thermal interface material 191, and the coating area of the thermal interface material 191 on the chip 14. Because the thermal interface material 191 is generally formed by filling thermally conductive metal particles into an inorganic material, it is difficult to increase a coefficient of thermal conductivity of the thermal interface material 191. In addition, if the coefficient of the thermal conductivity is increased from 8 W/mk to 10 W/mk, costs for the thermal interface material 191 are doubled. In other words, the thermal resistance of the thermal interface material 191 is reduced by increasing the coefficient of thermal conductivity of the thermal interface material 191, with a high processing difficulty and high costs.

Therefore, to reduce the thermal resistance of the thermal interface material 191, a main manner is to reduce the filling thickness of the thermal interface material 191 and increase the coating area of the thermal interface material 191. In the related technology, a coating area of the thermal gel is limited by dimensions of the chip 14, and cannot be further increased. In another related technology, the coating area of the thermal interface material 191 may be increased by adding a heat expansion plate.

Figure 3:
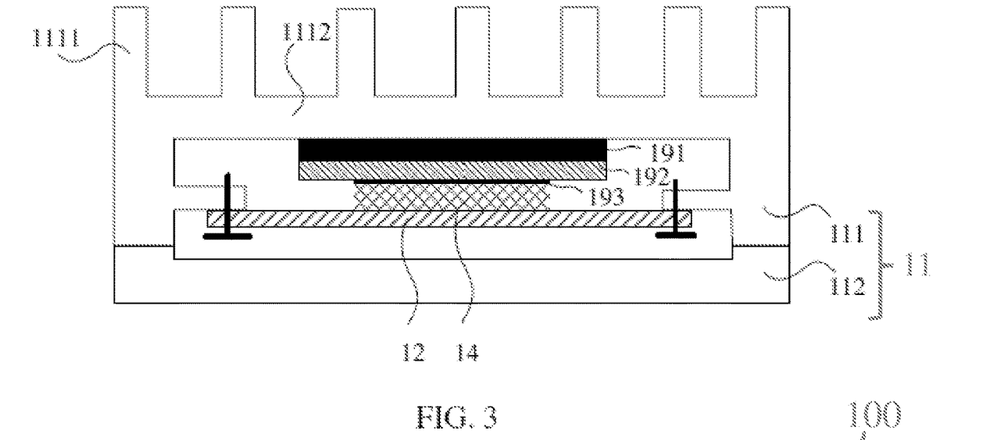
FIG. 3 is a schematic sectional view of another heat dissipation apparatus according to a related technology.

FIG. 3 is a schematic sectional view of another heat dissipation apparatus according to a related technology.

Referring to FIG. 3, a thermal interface material 191, a heat expansion plate 192, and a thermal silicone grease 193 are disposed between a chip 14 and a heat sink housing 11. The heat expansion plate 192 may be a metal plate with relatively high heat conduction efficiency. The thermal interface material 191 is disposed between the heat expansion plate 192 and the heat sink housing 11. An area of the heat expansion plate 192 is greater than an area of the chip 14. The heat expansion plate 192 is used to extend heat on the chip 14 to a larger area by using a flat plate with relatively good thermal conductivity, and then the thermal interface material 191 such as a thermal gel is filled on the heat expansion plate 192. In this case, a coating area of the thermal gel may be greatly increased, to reduce thermal resistance.

In the related technology, compared with a solution in which no heat expansion plate 192 is disposed, a temperature difference may be reduced by approximately 7° C. However, the heat expansion plate 192 needs to avoid other high devices on a primary printed circuit board 12, and an area of the heat expansion plate 192 is limited. In addition, after the area becomes larger, a heat expansion effect of the heat expansion plate 192 when emitting heat becomes poor, and an improvement effect is limited. Furthermore, a thermal silicone grease 193 needs to be filled between the heat expansion plate 192 and the chip 14, to reduce contact thermal resistance between the chip 14 and the heat expansion plate 192. However, in this way, one thermal interface material is added, and a coating procedure is added, increasing costs for materials and processing.

Based on the foregoing problem, embodiments of this disclosure provide a heat dissipation apparatus and an in-vehicle module. A chip with high power consumption is fastened to a sub printed circuit board, and the sub printed circuit board is connected to a primary printed circuit board or a primary heat dissipation plate of an upper housing by using an elastic support component, to enable the elastic support component to absorb an assembly tolerance, and enable the chip to be closely attached to a heat sink housing. This improves a heat dissipation capability of a heat dissipation module.

The following specifically describes, with reference to the accompanying drawings and specific embodiments, the heat dissipation apparatus and the in-vehicle module provided in the embodiments of this application.

Figure 4:
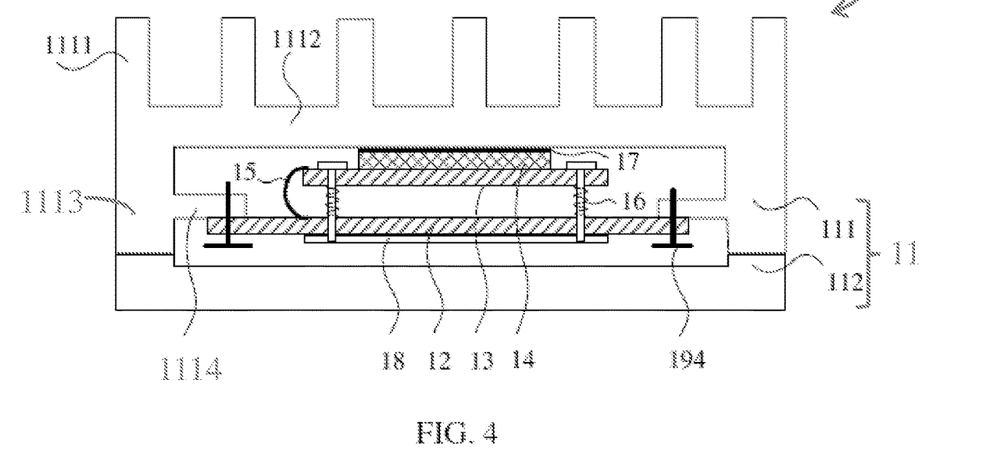
FIG. 4 is a schematic sectional view of a heat dissipation apparatus according to an embodiment of this application.
Figure 5:
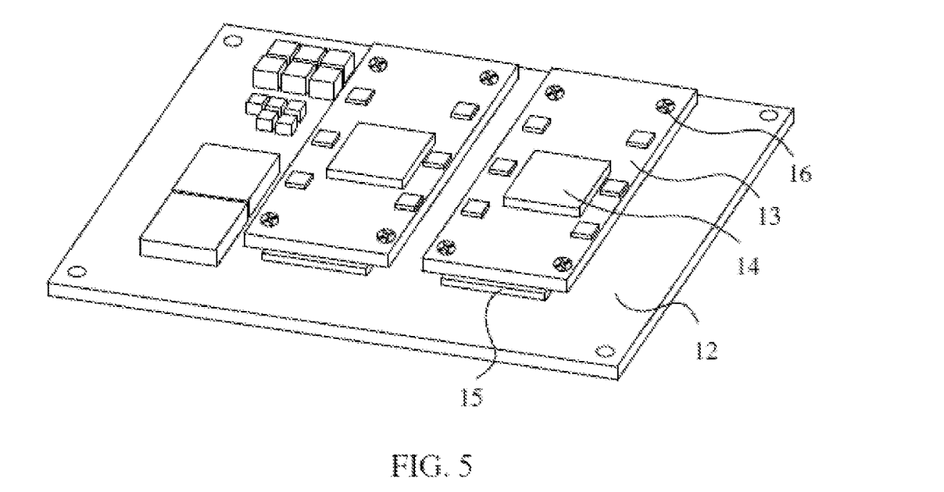
FIG. 5 is a schematic diagram of a structure of an inner assembly of a heat dissipation apparatus according to an embodiment of this application.

FIG. 4 is a schematic sectional view of a heat dissipation apparatus according to an embodiment of this application. FIG. 5 is a schematic diagram of a structure of an inner assembly of a heat dissipation apparatus according to an embodiment of this application. Referring to FIG. 4 and FIG. 5, an embodiment of this disclosure provides a heat dissipation apparatus 100. The heat dissipation apparatus 100 may include: a heat sink housing 11, and a primary printed circuit board 12, a sub printed circuit board 13, and a chip 14 that are disposed in an inner part of the heat sink housing 11.

The heat sink housing 11 may include an upper housing 111 and a lower housing 112. The upper housing 111 and the lower housing 112 are connected in a sealed manner. The upper housing 111 may include a primary heat dissipation plate 1112 and a side wall 1113 that is connected to a periphery of the primary heat dissipation plate 1112. The primary heat dissipation plate 1112 may be an air-cooled heat dissipation plate. For example, heat dissipation fins 1111 are disposed on an outer surface of the primary heat dissipation plate 1112, a plurality of heat dissipation fins 1111 are vertically disposed at intervals, and the plurality of heat dissipation fins 1111 are disposed relative to the primary heat dissipation plate 1112. Therefore, a heat dissipation surface with a relatively large area may be provided, and after heat on the upper housing 111 is conducted to the heat dissipation fins 1111, the heat may be dissipated to external air through radiation and convection. Alternatively, the primary heat dissipation plate 1112 may be a liquid-cooled heat dissipation plate. In this case, an inner part of the primary heat dissipation plate 1112 may be a hollow cavity, and a coolant such as water may be disposed in an inner part of the hollow cavity, to absorb the heat on the upper housing 111.

The primary printed circuit board 12 is fastened to the upper housing 111, and is located in an inner part of the side wall 1113. The primary printed circuit board 12 and the primary heat dissipation plate 1112 are disposed parallel and opposite to each other. A fixed boss 1114 is disposed to protrude from the side wall 1113 of the upper housing 111, and the primary printed circuit board 12 is fastened to the upper housing 111 by using the fixed boss 1114. For example, the primary printed circuit board 12 is fastened on the fixed boss 1114 by using a threaded fastener 194, the primary printed circuit board 12 and the primary heat dissipation plate 1112 are disposed opposite to each other, and the primary printed circuit board 12 is located on a side, away from the primary heat dissipation plate 1112, of the fixed boss 1114.

The sub printed circuit board 13 may be connected to a side, facing the primary heat dissipation plate 1112, of the primary printed circuit board 12, and the chip 14 may be fastened to the sub printed circuit board 13. Both the sub printed circuit board 13 and the primary printed circuit board 12 may be printed circuit boards. An area of the sub printed circuit board 13 is less than an area of the primary printed circuit board 12, and the area of the sub printed circuit board 13 is greater than an area of the chip 14, and the sub printed circuit board 13 is configured to fasten the chip 14. The chip 14 and peripheral components of the chip 14 may be soldered on the sub printed circuit board 13, to form an independent integral component. After the sub printed circuit board 13 is added, space originally used to mount the chip 14 may be left for the primary printed circuit board 12. Equivalently, a layout area of an electronic device of the primary printed circuit board 12 is expanded. This helps to improve utilization of inner space of the heat dissipation apparatus 100.

A quantity of the sub printed circuit boards 13 may be determined based on a quantity of the chips 14. There may be one or more sub printed circuit boards. At least one chip 14 may be disposed on one sub printed circuit board 13. By disposing a plurality of sub printed circuit boards 13, heat between each of the plurality of chips 14 with high power consumption and the primary heat dissipation plate 1112 of the heat sink housing 11 may be dissipated through conduction. In addition, the plurality of sub printed circuit boards 13 are separately disposed. In comparison with disposing of a sub printed circuit board 13 that has a relatively large area and that is capable of fastening the plurality of chips with high power consumption 14, other high devices on the primary printed circuit board 12 may be avoided to a large extent. This facilitates arrangement of electronic devices on the primary printed circuit board 12.

To implement signal connection, the sub printed circuit board 13 may be electrically connected to the primary printed circuit board 12 by using a flexible conductive component 15, and the flexible conductive component 15 may be a flexible circuit board, a flexible connector, a cable, or the like. The flexible conductive component 15 may implement signal interconnection between the sub printed circuit board 13 and the primary printed circuit board 12, that is, implement signal interconnection between the chip 14, a peripheral component of the chip 14, and the primary printed circuit board 12. In addition, because of a flexible feature of the flexible conductive component 15, reliability of an electrical connection of the sub printed circuit board 13 when floating up and down in a mounting process, can be ensured.

Still referring to FIG. 4, to implement a structural connection, in a possible implementation, the sub printed circuit board 13 may be connected to the primary printed circuit board 12 by using the elastic support component 16, and the elastic support component 16 is configured to press the sub printed circuit board 13, to enable the chip 14 to be closely attached to the primary heat dissipation plate 1112 of the upper housing 111.

The elastic support component 16 may include a spring screw, an elastic spring, or the like. The elastic support component 16 has a sufficient support strength, and may be elastically deformed, to provide an elastic force. When the elastic support component 16 is a spring screw shown in the figure, a head of the spring screw is located on a side, opposite to the primary printed circuit board 12, of the sub printed circuit board 13. A tail of the spring screw is connected to the primary printed circuit board 12, and a spring of the spring screw is located between the sub printed circuit board 13 and the primary printed circuit board 12. When the spring is in a compressed state, the spring provides an upward pressure for the sub printed circuit board 13, to enable the chip 14 to be closely attached to the primary heat dissipation plate 1112.

In this embodiment of this application, a structural support plate 18 is further disposed on a side, away from the sub printed circuit board 13, of the primary printed circuit board 12. The structural support plate 18 is fastened to the primary printed circuit board 12, and a projection of the elastic support component 16 on the primary printed circuit board 12 falls within a range of a projection of the structural support plate on the primary printed circuit board 12. The structural support plate 18 may be, for example, a metal plate such as a stainless steel or aluminum alloy, and has a relatively high structural strength. The structural support plate 18 may be adhered to the primary printed circuit board 12, or fastened to the primary printed circuit board 12 by using a fastener. For example, the tail of the spring screw may fasten the primary printed circuit board 12 and the structural support plate 18. By disposing the structural support plate 18, rigidity of the primary printed circuit board may be increased. This may prevent a stress sensitive device on the primary printed circuit board 12 from being damaged and disabled because of a deformation of the primary printed circuit board 12 caused by an elastic force of the elastic support component 16.

Figure 6:
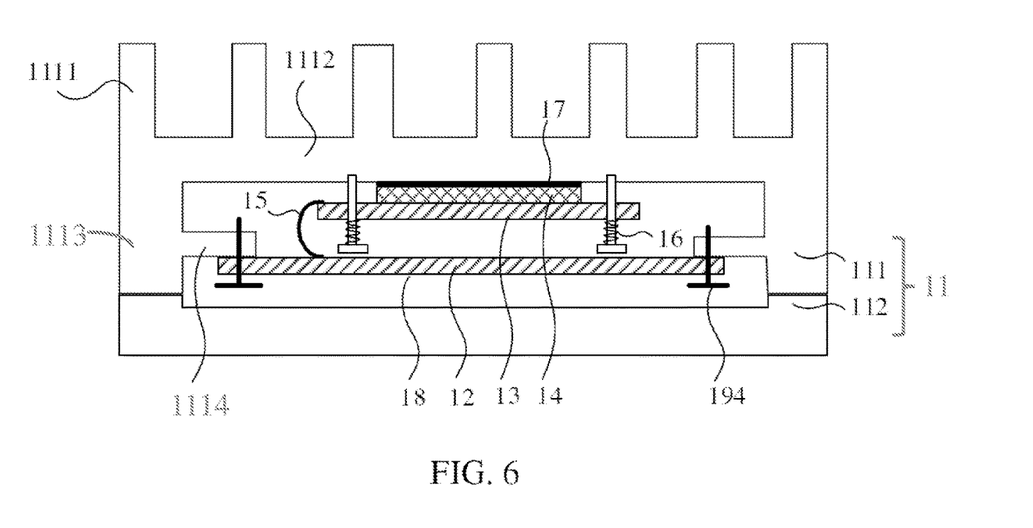
FIG. 6 is another schematic sectional view of a heat dissipation apparatus according to an embodiment of this application.

FIG. 6 is another schematic sectional view of a heat dissipation apparatus according to an embodiment of this application. Referring to FIG. 6, in another possible implementation, the sub printed circuit board 13 may be connected to the primary heat dissipation plate 1112 by using the elastic support component 16, and the elastic support component 16 is configured to press the sub printed circuit board 13, to enable the chip 14 to be closely attached to the primary heat dissipation plate 1112 of the upper housing 111.

When the elastic support component 16 is the spring screw shown in the figure, the head of the spring screw is located on a side, opposite to the primary heat dissipation plate 1112, of the sub printed circuit board 13. The tail of the spring screw is connected to the primary heat dissipation plate 1112, and the spring of the spring screw is located between the sub printed circuit board 13 and the head of the spring screw. When the spring is in a compressed state, the spring provides an upward pressure for the sub printed circuit board 13, to enable the chip 14 to be closely attached to the primary heat dissipation plate 1112.

It should be understood that, a compression amount of the spring of the spring screw may fall within an appropriate range. The compression amount of the spring may not be excessively large. A pressure borne by the chip 14 may fall within a range allowed by the chip 14, to prevent the chip 14 from being damaged due to excessive squeezing. In addition, the compression amount of the spring may not be excessively small. It should be ensured that when the heat dissipation apparatus is vibrated, the chip 14 is always firmly pressed on the primary heat dissipation plate 1112, and is not detached.

There may be one elastic support component 16, disposed in a center of the sub printed circuit board 13. Alternatively, there may be a plurality of elastic support components 16, and the plurality of elastic support components 16 are evenly distributed on the sub printed circuit board 13, to provide a uniform and reliable support force for the sub printed circuit board 13. In addition, overall service life of the elastic support component may be improved.

The elastic support component 16 may absorb a tolerance, to enable the chip 14 to be closely attached to a heat sink housing 11, implementing efficient heat dissipation of the chip 14 with high power consumption through conduction. It should be understood that, in this embodiment of this application, the chip 14 has a thickness tolerance, the heat sink housing 11 has a tolerance, that is, a height tolerance of the fixed boss 1114, and the sub printed circuit board 13 also has a thickness tolerance. Therefore, a distance between the chip 14 and the primary heat dissipation plate 1112 is not a fixed value. In addition, the upper housing 111 and the lower housing 112 that are connected in the sealed manner may not float up and down for adjustment, that is, the three tolerances are not absorbed by changing a position of the upper housing 111 or the lower housing 112.

In this embodiment of this application, the elastic support component 16 may be deformed and contracted after being subject to a force. When the distance between the chip 14 and the primary heat dissipation plate 1112 is relatively small, a deformation degree of the elastic support component 16 is relatively small. When the distance between the chip 14 and the primary heat dissipation plate 1112 is relatively large, the deformation degree of the elastic support component 16 is relatively large. The chip 14 may float up and down by using the elastic support component 16, to enable the chip 14 to be always pressed on the primary heat dissipation plate 1112 of the heat sink housing 11. This ensures that good contact thermal conduction may be maintained between the chip 14 and the heat sink housing 11.

It should be noted that the compression amount of the elastic support component 16 may be properly set by controlling a gap between the primary printed circuit board 12 and the primary heat dissipation plate 1112 and a gap between the sub printed circuit board 13 and the primary heat dissipation plate 1112, to ensure that the pressure borne by the chip 14 falls within a safe range allowed by the chip 14. In addition, when the heat dissipation apparatus 100 is applied to an in-vehicle module, it may be ensured that, when the in-vehicle module is vibrated during running of a vehicle, the chip 14 is always pressed on the primary heat dissipation plate 1112 of the heat sink housing 11 under an action of the elastic support component 16, and is not detached. In this way, it may be ensured that functions of the in-vehicle module are stable, and heat dissipation is kept effective.

Under the action of the elastic support component 16, the chip 14 is closely attached to the primary heat dissipation plate 1112, and a gap between the chip 14 and the primary heat dissipation plate 1112 may be approximate to 0. However, when the chip 14 is directly attached to the primary heat dissipation plate 1112, thermal resistance between the chip 14 and the primary heat dissipation plate 1112 is relatively large. In this embodiment of this application, a thermally conductive layer 17 is filled between the chip 14 and the primary heat dissipation plate 1112 of the upper housing 111, and the thermally conductive layer 17 is configured to reduce contact thermal resistance between the chip 14 and the upper housing 111.

The thermally conductive layer 17 may include a thermal interface material such as a thermal silicone grease or a thermal phase change film. A coefficient of thermal conductivity of the thermal silicone grease and a coefficient of thermal conductivity of the thermal phase change film are relatively low, and a smallest thickness may be achieved in a process, for example, the thickness is less than or equal to 0.1 mm. A thickness of the thermally conductive layer 17 may be less than 0.2 mm. In a possible implementation, the thermally conductive layer 17 may be the thermal silicone grease. A thickness of the thermal silicone grease is 0.1 mm, that is, 0.0001 m.

A thermal silicone grease with a thickness of 0.0001 m is used as an example of the thermally conductive layer 17. The coefficient of thermal conductivity of the thermal silicone grease is approximately 6 W/mk. With reference to the foregoing related technology, a coating area on a chip is still 0.024 m×0.024 m. A filling thickness, the coefficient of thermal conductivity, and the coating area on a chip are substituted into Formula 1, to obtain thermal resistance of the thermal silicone grease, that is, 0.029° C./W.

The artificial intelligence AI chip in an in-vehicle autonomous driving module is still used as an example. Power consumption of the chip is 66 W. The power consumption of the chip and the thermal resistance of the thermal silicone grease are substituted into Formula 2, to obtain a temperature difference between an upper surface and a lower surface of the thermal silicone grease, that is, 1.9° C. Compared with the temperature difference of 14° C. in the foregoing related technology, a temperature difference is reduced by approximately 12° C., and an effect is significantly obvious. Apparently, according to the heat dissipation apparatus provided in this embodiment of this application, a temperature of the chip 14 can be effectively reduced, and an over-temperature risk of the chip 14 can be reduced.

In addition, in the related technology, the chip 14 is directly soldered to the primary printed circuit board 12. If a capability of the chip 14 is improved, the primary printed circuit board 12 needs to be re-developed. Therefore, overall evolutionability is poor, and costs for update and replacement are high. However, in this embodiment of this application, the sub printed circuit board 13 and the elastic support component 16 are connected in a detachable manner, and the sub printed circuit board 13 and the chip 14 may form a replaceable component. Due to this disposing, not only requirements of different customers for different types of chips may be met, but also applicability is high. In addition, if the capability of the chip 14 is to be upgraded, only the chip 14 and the sub printed circuit board 13 need to be replaced. Therefore, an evolution capability is strong, and costs for upgrade and replacement are high.

An assembly process of the heat dissipation apparatus 100 provided in this embodiment of this disclosure may be as follows: First, the chip 14 and peripheral components of the chip 14 are soldered to the sub printed circuit board 13; then the flexible conductive component 15 is connected to the primary printed circuit board 12 and the sub printed circuit board 13; next, the sub printed circuit board 13 is fastened to the primary printed circuit board 12 or the primary heat dissipation plate 1112 by using the elastic support component 16, and the thermally conductive layer 17 is coated on the chip 14; the primary printed circuit board 12 is mounted on the fixed boss 1114 by using the threaded fastener 194; and finally, the upper housing 111 and the lower housing 112 are connected in a sealed manner by dispensing adhesive.

According to the heat dissipation apparatus provided in this embodiment of this application, the chip with high power consumption is separately fastened to the sub printed circuit board, and the sub printed circuit board is fastened to the primary printed circuit board or the primary heat dissipation surface of the upper housing by using the spring screw or another elastic support component. Therefore, signal interconnection is implemented between the sub printed circuit board and the primary printed circuit board by using the flexible conductive component. The elastic support component may absorb the assembly tolerance, to enable the chip to be closely attached to the heat sink housing. This may greatly reduce a thickness of the thermally conductive layer between the chip and the heat sink housing, reduce thermal resistance of the thermally conductive layer, effectively reduce the temperature of the chip, and reduce the over-temperature risk of the chip.

According to another aspect of embodiments of this application, an in-vehicle module is further provided. The in-vehicle module includes a connector 200 and the heat dissipation apparatus 100 provided in the foregoing embodiments. The heat dissipation apparatus 100 includes the heat sink housing 11, and the primary printed circuit board 12, the sub printed circuit board 13, and the chip 14 that are disposed in the inner part of the heat sink housing 11. The connector 200 is connected to the primary printed circuit board 12 in the inner part of the heat sink housing 11. In addition, the connector 200 is connected to the heat sink housing 11 in the sealed manner.

The in-vehicle module may be, for example, an intelligent driving computing module, a power module, or the like. The in-vehicle module may be mounted at a position of an electric vehicle, such as in an engine compartment, in a front passenger glove box, under a seat, or the like. At the position, the in-vehicle module needs to support a maximum of 80° C. ambient temperature. A heat dissipation environment is extremely harsh. Therefore, a requirement for a heat dissipation capability of the in-vehicle module is high. In addition, the in-vehicle module needs to be designed based on a dust-proof level and water-proof level of an outdoor module. The dust-proof level and water-proof level may be IP67.

According to the in-vehicle module provided in this embodiment of this application, the upper housing and the lower housing of the heat dissipation apparatus of the in-vehicle module are connected in the sealed manner by dispensing adhesive. Therefore, dust-proof and water-proof design requirements may be met. In addition, after the upper housing and the lower housing are fastened by dispensing adhesive, the upper housing and the lower housing do not float up and down. Therefore, reliability of fastening the connector is high, to prevent a connection failure of the connector. The chip with high power consumption is separately fastened to the sub printed circuit board, and the sub printed circuit board is fastened to the primary printed circuit board by using the elastic support component. The elastic support component may absorb the assembly tolerance, to enable the chip to be closely attached to the heat sink housing. This can effectively reduce the over-temperature risk of the chip, and help to improve an overall heat dissipation effect of the in-vehicle module.

In addition, it should be noted that, in addition to being applied to the in-vehicle module, a structure of the heat dissipation apparatus provided in the foregoing embodiments of this disclosure may be applied to a technical field such as an outdoor module that has a relatively high dust-proof level and water-proof level, and an electronic device terminal.

Finally, it should be noted that the foregoing embodiments are merely intended for describing the technical solutions of the embodiments of this disclosure other than limiting embodiments of this application. Although embodiments of this disclosure are described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of embodiments of this application.

What is claimed is:

1. A heat dissipation apparatus comprising: a heat sink housing, a primary printed circuit board, a sub printed circuit board, and a chip, wherein
the heat sink housing comprises an upper housing and a lower housing, the upper housing and the lower housing are connected in a sealed manner, the upper housing comprises a primary heat dissipation plate, the primary printed circuit board is fastened to the upper housing, and the primary printed circuit board and the primary heat dissipation plate are disposed opposite to each other;
the chip is fastened to the sub printed circuit board, the sub printed circuit board is electrically connected to the primary printed circuit board by using a flexible conductive component, the sub printed circuit board is connected to the primary printed circuit board or the primary heat dissipation plate by using an elastic support component, and the elastic support component is configured to press the sub printed circuit board, to enable the chip to be pressed toward the primary heat dissipation plate; and
a thermally conductive layer is arranged between the chip and the primary heat dissipation plate, and the thermally conductive layer is configured to reduce contact thermal resistance between the chip and the primary heat dissipation plate.

2. The heat dissipation apparatus according to claim 1, wherein the sub printed circuit board is detachably connected to the elastic support component, and the sub printed circuit board and the chip form a replaceable component.

3. The heat dissipation apparatus according to claim 1, wherein the elastic support component comprises a spring screw or an elastic spring.

4. The heat dissipation apparatus according to claim 3, wherein the elastic support component comprises the spring screw, a head of the spring screw is located on a side, opposite to the primary printed circuit board, of the sub printed circuit board, a tail of the spring screw is connected to the primary printed circuit board, and a spring of the spring screw is located between the sub printed circuit board and the primary printed circuit board.

5. The heat dissipation apparatus according to claim 4, wherein a structural support plate is further disposed on a side, away from the sub printed circuit board, of the primary printed circuit board, the structural support plate is fastened to the primary printed circuit board, and a projection of the elastic support component on the primary printed circuit board falls within a range of a projection of the structural support plate on the primary printed circuit board.

6. The heat dissipation apparatus according to claim 3, wherein the elastic support component comprises the spring screw, a head of the spring screw is located on a side, opposite to the primary heat dissipation plate, of the sub printed circuit board, a tail of the spring screw is connected to the primary heat dissipation plate, and a spring of the spring screw is located between the sub printed circuit board and the head of the spring screw.

7. The heat dissipation apparatus according to claim 1, wherein a thickness of the thermally conductive layer is less than 0.2 mm and greater than 0.0 mm.

8. The heat dissipation apparatus according to claim 7, wherein the thermally conductive layer comprises a thermal silicone grease or a thermal phase change film.

9. The heat dissipation apparatus according to claim 1, wherein the flexible conductive component comprises a flexible circuit board, a flexible connector, or a cable.

10. The heat dissipation apparatus according to claim 1, wherein the heat dissipation apparatus further comprises at least another elastic support component such that there are a plurality of the elastic support components, and the plurality of the elastic support components are evenly distributed on the sub printed circuit board.

11. The heat dissipation apparatus according to claim 1, wherein the heat dissipation apparatus further comprises at least another sub printed circuit board such that there are a plurality of the sub printed circuit boards, and at least one chip is disposed on one of the plurality of the sub printed circuit boards.

12. The heat dissipation apparatus according to claim 1, wherein the primary heat dissipation plate is an air-cooled heat dissipation plate or a liquid-cooled heat dissipation plate.

13. An in-vehicle module comprising:
a dissipation apparatus comprising:
a heat sink housing,
a primary printed circuit board,
a sub printed circuit board, and
a chip, wherein
the heat sink housing comprises an upper housing and a lower housing, the upper housing and the lower housing are connected in a sealed manner, the upper housing comprises a primary heat dissipation plate, the primary printed circuit board is fastened to the upper housing, and the primary printed circuit board and the primary heat dissipation plate are disposed opposite to each other;
the chip is fastened to the sub printed circuit board, the sub printed circuit board is electrically connected to the primary printed circuit board by using a flexible conductive component, the sub printed circuit board is connected to the primary printed circuit board or the primary heat dissipation plate by using an elastic support component, and the elastic support component is configured to press the sub printed circuit board, to enable the chip to be pressed toward to the primary heat dissipation plate; and a thermally conductive layer is arranged between the chip and the primary heat dissipation plate, and the thermally conductive layer is configured to reduce contact thermal resistance between the chip and the primary heat dissipation plate.

14. The in-vehicle module according to claim 13, wherein the sub printed circuit board is detachably connected to the elastic support component, and the sub printed circuit board and the chip form a replaceable component.

15. The in-vehicle module according to claim 13, wherein the elastic support component comprises a spring screw or an elastic spring.

16. The in-vehicle module according to claim 15, wherein the elastic support component comprises the spring screw, a head of the spring screw is located on a side, opposite to the primary printed circuit board, of the sub printed circuit board, a tail of the spring screw is connected to the primary printed circuit board, and a spring of the spring screw is located between the sub printed circuit board and the primary printed circuit board.

17. The in-vehicle module according to claim 16, wherein a structural support plate is further disposed on a side, away from the sub printed circuit board, of the primary printed circuit board, the structural support plate is fastened to the primary printed circuit board, and a projection of the elastic support component on the primary printed circuit board falls within a range of a projection of the structural support plate on the primary printed circuit board.

18. The in-vehicle module according to claim 15, wherein the elastic support component comprises the spring screw, a head of the spring screw is located on a side, opposite to the primary heat dissipation plate, of the sub printed circuit board, a tail of the spring screw is connected to the primary heat dissipation plate, and a spring of the spring screw is located between the sub printed circuit board and the head of the spring screw.

19. The in-vehicle module according to claim 13, wherein a thickness of the thermally conductive layer is less than 0.2 mm and greater than 0.0 mm.

20. The in-vehicle module according to claim 19, wherein the thermally conductive layer comprises a thermal silicone grease or a thermal phase change film.

* * * * *